(12) United States Patent
Wu et al.

(10) Patent No.: US 11,073,558 B2
(45) Date of Patent: Jul. 27, 2021

(54) CIRCUIT HAVING MULTIPLE SCAN MODES FOR TESTING

(71) Applicant: Realtek Semiconductor Corp., HsinChu (TW)

(72) Inventors: Tzung-Jin Wu, Taipei (TW); Jeong-Fa Sheu, Taoyuan (TW); Po-Lin Chen, Taoyuan (TW); Yin-Ping Chern, Chiayi County (TW); Ying-Yen Chen, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/699,700

(22) Filed: Dec. 1, 2019

(65) Prior Publication Data

US 2020/0182933 A1 Jun. 11, 2020

(30) Foreign Application Priority Data

Dec. 5, 2018 (TW) .................................. 107143546

(51) Int. Cl.
*G01R 31/00* (2006.01)
*G01R 31/3185* (2006.01)

(52) U.S. Cl.
CPC ................ *G01R 31/318536* (2013.01); *G01R 31/318583* (2013.01)

(58) Field of Classification Search
None
See application file for complete search history.

(56) References Cited

U.S. PATENT DOCUMENTS

| 5,347,519 A * | 9/1994 | Cooke | G01R 31/31727 |
| | | | 714/724 |
| 5,701,308 A * | 12/1997 | Attaway | G01R 31/318335 |
| | | | 714/25 |
| 2002/0070744 A1* | 6/2002 | Linn | G01R 31/318572 |
| | | | 324/750.3 |
| 2006/0248419 A1* | 11/2006 | Colunga | G01R 31/318555 |
| | | | 714/727 |
| 2007/0061644 A1 | 3/2007 | Birmiwal | |

(Continued)

OTHER PUBLICATIONS

S. Ahlawat, J. Tudu, A. Matrosova and V. Singh, "A High Performance Scan Flip-Flop Design for Serial and Mixed Mode Scan Test," in IEEE Transactions on Device and Materials Reliability, vol. 18, No. 2, pp. 321-331, Jun. 2018, doi: 10.1109/TDMR.2018. 2835414. (Year: 2018).*

*Primary Examiner* — Daniel F. McMahon
(74) *Attorney, Agent, or Firm* — Winston Hsu (57) ABSTRACT

A circuit having multiple scan modes is disclosed. The circuit includes a first circuit block and a second circuit block. The first circuit block corresponds to a first scan mode of the multiple scan modes, and the first circuit block includes at least one first scan chain for receiving a test signal from an external automatic test equipment. The second circuit block corresponds to a second scan mode of the multiple scan modes, and the second circuit block includes at least one second scan chain for receiving another test signal from the external automatic test equipment. The second scan chain includes at least one specific flip-flop positioned in the first circuit block, and the specific flip-flop is configured to drive the second circuit block.

9 Claims, 5 Drawing Sheets

(56) References Cited

U.S. PATENT DOCUMENTS

| | | | | |
|---|---|---|---|---|
| 2011/0289369 A1* | 11/2011 | Lee | ............... | G01R 31/318547 |
| | | | | 714/726 |
| 2013/0219238 A1* | 8/2013 | Tekumalla | ..... | G01R 31/318552 |
| | | | | 714/729 |
| 2014/0149812 A1* | 5/2014 | Tekumalla | ....... | G01R 31/31705 |
| | | | | 714/727 |

* cited by examiner

CIRCUIT HAVING MULTIPLE SCAN MODES FOR TESTING

BACKGROUND OF THE INVENTION

1. Field of the Invention

The present invention is related to chip testing, and more particularly, to a scan chain design used during chip testing.

2. Description of the Prior Art

Commonly, an integrated circuit or chip may have a built-in scan chain circuit for detecting various possible defects which occur during manufacturing process. More particularly, an engineer may input a known test vector to a scan chain input terminal of a chip via an external automatic test equipment (ATE), and determine whether the chip has any defects by measuring and comparing scan chain output value(s) of the chip. In this way, products having defect(s) can be identified during a mass production phase.

Due to the developments in integrated circuit process technologies, the number of memory units (e.g. flip-flops) in a chip increases. Limited by the constraints of circuit size and power consumption during testing, a single chip may be partitioned corresponding to multiple scan modes, and only a partial circuit block of the chip is tested in each scan mode.

Utilized conventional electronic design automatic tools can implement scan chain circuits for each corresponding circuit block according to its scan mode, but is unable to control or measure circuit blocks belonging to other scan modes. Since different circuit blocks are not completely independent (i.e. there are interconnections between different circuit blocks for signal transmission), the current testing method cannot detect the defects of the interconnections between circuit blocks in different scan modes and combinational logic circuits connected with one another; fault coverage is therefore reduced.

A core wrapper proposed by IEEE 1500 can be configured to provide a circuit block under test with specific logic values, and to solve the problem of the circuit block under test being unable to receive the logic values from another circuit block. Although the aforementioned core wrapper method can increase the fault coverage, the circuit area required and the time for signal transmission may be increased as well.

SUMMARY OF THE INVENTION

Thus, an objective of the present invention is to provide a solution, which can completely test interconnections of circuit blocks in different scan modes and determine whether functions of combinational logic circuits connected with each other are correct under a condition of utilizing multiple scan modes for testing, wherein there is no need to greatly increase the circuit area.

In an embodiment of the present invention, a circuit applied to multiple scan modes for testing is disclosed, comprising a first circuit block and a second circuit block. The first circuit block corresponds to a first scan mode of the multiple scan modes, and comprises at least one first scan chain for receiving a test signal from an external automatic test equipment to perform testing. The second circuit block corresponds to a second scan mode of the multiple scan modes, and comprises at least one second scan chain for receiving another test signal from the external automatic test equipment to perform testing, wherein the second scan chain comprises at least one specific flip-flop positioned in the first circuit block and configured to drive the second circuit block.

In another embodiment of the present invention, a circuit applied to multiple scan modes for testing is disclosed, which comprises a plurality of circuit blocks respectively corresponding to their scan modes, wherein each circuit block comprises a boundary circuit. The boundary circuits of the corresponding circuit blocks are connected in series as a boundary scan chain, and the boundary scan chain receives a test signal from an external automatic test equipment to perform testing.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
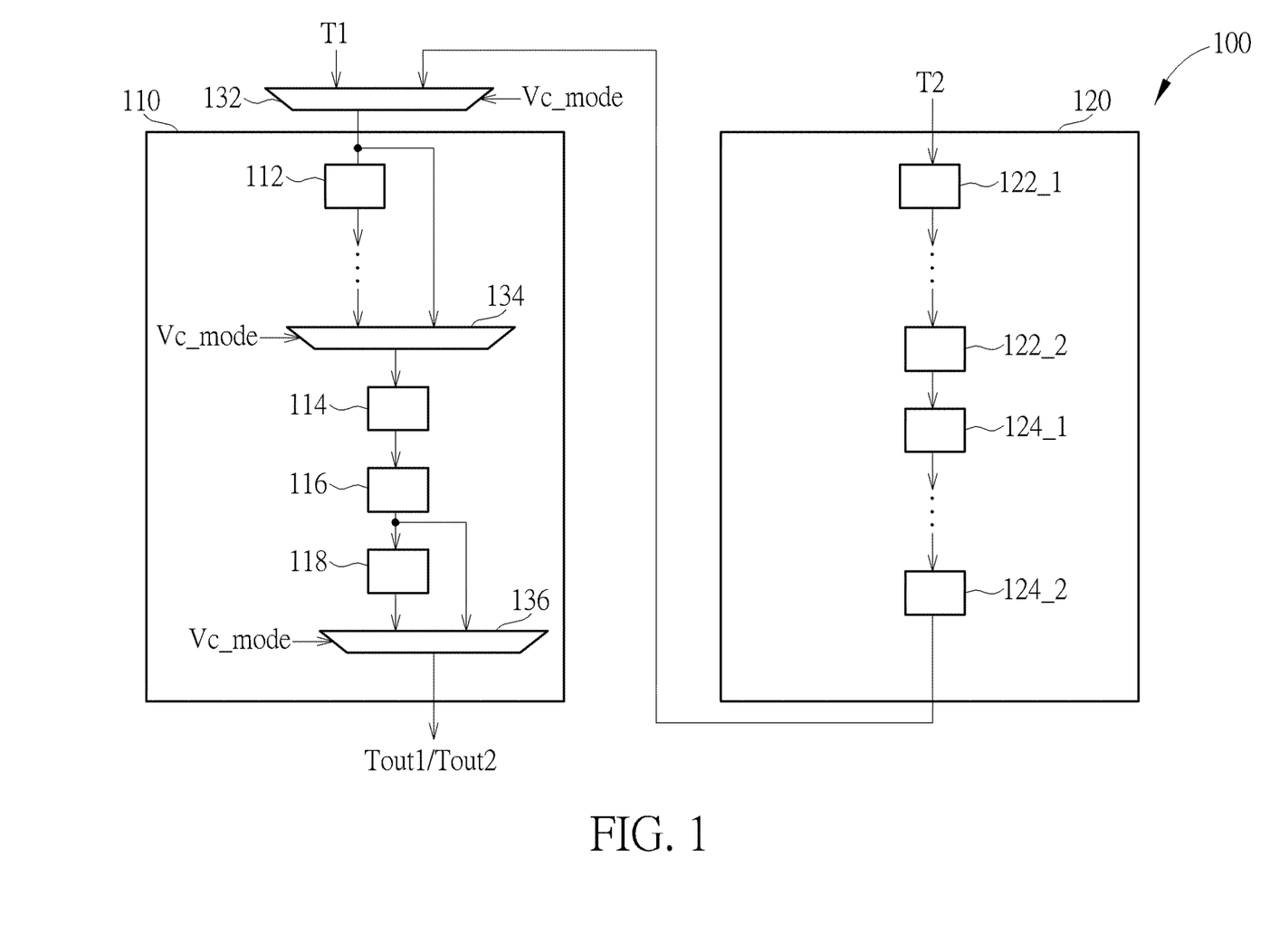
FIG. 1 is a diagram illustrating a chip with multiple scan modes for testing according to an embodiment of the present invention.

FIG. 1 is a diagram illustrating a chip 100 applied to multiple scan modes for testing according to an embodiment of the present invention. As shown in FIG. 1, the chip 100 comprises a first circuit block 110 and a second circuit block 120, where the first circuit block 110 and the second circuit block 120 respectively correspond to a first scan mode and a second scan mode, and the first scan mode and the second scan mode respectively receive a first test signal T1 and a second test signal T2 from an external automatic test equipment (not shown) at different time points, to test whether functions of the first circuit block 110 and the second circuit block 120 are correct. Both the first circuit block 110 and the second circuit block 120 comprise a plurality of scan chains to connect a plurality of logic circuits in series for testing, but only two scan chains are illustrated in FIG. 1.

In this embodiment, the first circuit block 110 comprises several flip-flops 112, 114, 116 and 118, and two multiplexers 134 and 136, and the second circuit block 120 comprises some first flip-flops (such as negative edge-triggered flip-flops 122_1 and 122_2 in this embodiment) and a plurality of second flip-flops (such as positive edge-triggered flip-flops 124_1 and 124_2 in this embodiment). In this embodiment, it is assumed that the flip-flops 114 and 116 within the first circuit block 110 may generate driving signals or digital signals into the second circuit block 120 during functional operations of the chip 100; in other words, there are interconnections and signal transmissions between the flip-flops {114, 116} within the first circuit block 110 and the second circuit block 120.

When performing a scan chain test, there is a need for conforming to a test protocol. Thus, a serial connection of the scan chains within the first circuit block 110 and the second circuit block 120 must conform to the test protocol in order to correctly finish the test. In this embodiment, a test protocol specification is assumed that all negative edge-triggered flip-flops have to be positioned ahead of positive edge-triggered flip-flops in one scan chain, where the embodiment of FIG. 1 is illustrated based on this test protocol, but the present invention is not limited thereto.

In this embodiment, the first circuit block 110 comprises a first scan chain, where the first scan chain sequentially comprises the flip-flops 112, 114, 116 and 118. In addition, the flip-flops 114 and 116 within the first circuit block 110 may generate the driving signals or the digital signals to the second circuit block 120 during the functional operations of the chip 100, and the flip-flops 114 and 116 are assumed to be positive edge-triggered flip-flops. The flip-flops 114 and 116 may be positioned behind a second scan chain within the second circuit block 120, and the second scan chain therefore sequentially comprises the negative edge-triggered flip-flops 122_1 and 122_2, the positive edge-triggered flip-flops 124_1 and 124_2, and the flip-flops 114 and 116. In detail, when the chip 100 performs a test of the first scan mode, the external automatic test equipment may input the first test signal T1 and generate a control signal Vc_mode for controlling multiplexers 132, 134 and 136 to test the first scan chain; at this moment, the first test signal T1 may sequentially pass through the multiplexers 132, the flip-flop 112, the multiplexer 134, the flip-flops 114, 116 and 118, and the multiplexer 136, and then generate a test result Tout1 in order to determine whether functions of the aforementioned components are correct. When the chip 100 performs a test of the second scan mode, the external automatic test equipment may input the second test signal T2 and generate the control signal Vc_mode to control the multiplexers 132, 134 and 136 to test the second scan chain; at this moment, the second test signal T2 may sequentially pass through the negative edge-triggered flip-flops 122_1 and 122_2, the positive edge-triggered flip-flops 124_1 and 124_2, the multiplexer 132, the multiplexer 134, the flip-flops 114 and 116, and the multiplexer 136, and then generate a test result Tout2 in order to determine whether functions of the aforementioned components are correct.

As mentioned above, the flip-flops 114 and 116 within the first circuit block 110, which is configured to drive the second circuit block 120, may be merged into the second scan chain of the second circuit block 120 for completely testing the interconnections between the first circuit block 110 and the second circuit block 120 and combinational logic circuits connected with each other when testing the second scan chain, which can increase integrity of the test. Furthermore, the flip-flops 114 and 116 within the first circuit block 110 may be set to belong to different scan chains at different time points according to control of the multiplexers 132, 134 and 136, i.e. the flip-flops 114 and 116 may be tested in both the different modes. Compared with the original circuit, only the multiplexers 132, 134 and 136 are added to the chip 100 in this embodiment, which will not greatly increase the circuit area and manufacturing costs.

Figure 2:
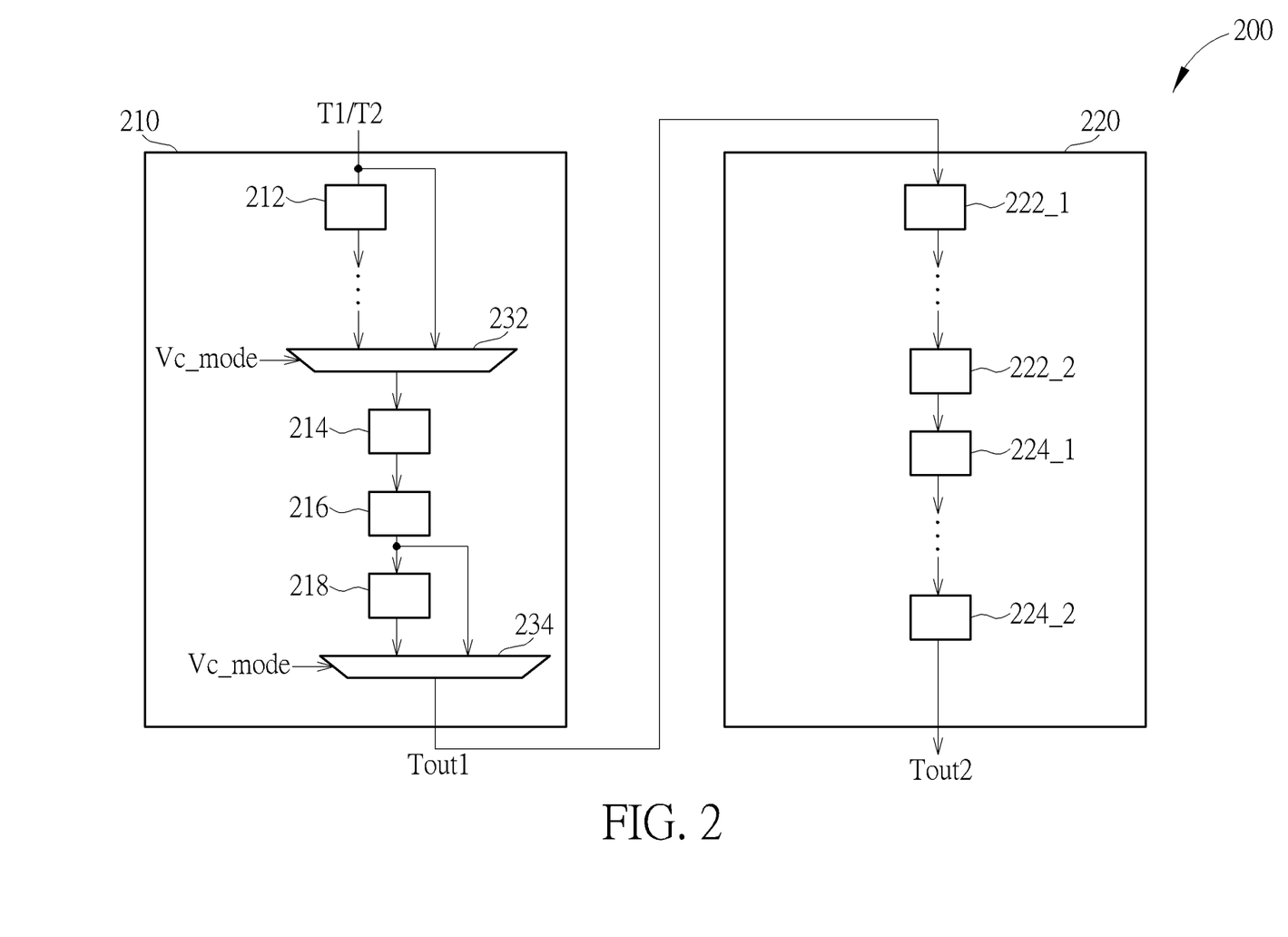
FIG. 2 is a diagram illustrating a chip with multiple scan modes for testing according to another embodiment of the present invention.

FIG. 2 is a diagram illustrating a chip 200 applied to multiple scan modes for testing according to another embodiment of the present invention. As shown in FIG. 2, the chip 200 comprises a first circuit block 210 and a second circuit block 220, where the first circuit block 210 and the second circuit block 220 respectively correspond to a first scan mode and a second scan mode, and the first scan mode and the second scan mode respectively receive a first test signal T1 and a second test signal T2 from an external automatic test equipment at different time points, to test whether functions of the first circuit block 210 and the second circuit block 220 are correct.

In this embodiment, the first circuit block 210 comprises several flip-flops 212, 214, 216 and 218, and two multiplexers 232 and 234, and the second circuit block 220 comprises some first flip-flops (such as negative edge-triggered flip-flops 222_1 and 222_2 in this embodiment) and a plurality of second flip-flops (such as positive edge-triggered flip-flops 224_1 and 224_2 in this embodiment). In this embodiment, it is assumed that the flip-flops 214 and 216 within the first circuit block 210 may generate driving signals or digital signals into the second circuit block 220 during functional operations of the chip 200; in other words, there are interconnections and signal transmissions between the flip-flops {214, 216} within the first circuit block 210 and the second circuit block 220.

In this embodiment, a test protocol specification assumes that all negative edge-triggered flip-flops have to be positioned ahead of positive edge-triggered flip-flops in one scan chain, where the embodiment of FIG. 2 is illustrated based on this test protocol, but the present invention is not limited thereto.

In this embodiment, the first circuit block 210 comprises a first scan chain, where the first scan chain sequentially comprises the flip-flops 212, 214, 216 and 218. In addition, the flip-flops 214 and 216 within the first circuit block 210 may generate the driving signals or the digital signals to the second circuit block 220 during the functional operations of the chip 200. The flip-flops 214 and 216 are assumed to be negative edge-triggered flip-flops, thus the flip-flops 214 and 216 may be positioned ahead of a second scan chain within the second circuit block 220, and the second scan chain therefore sequentially comprises the flip-flops 214 and 216, the negative edge-triggered flip-flops 222_1 and 222_2, and the positive edge-triggered flip-flops 224_1 and 224_2. In detail, when the chip 200 performs a test of the first scan mode, the external automatic test equipment may input the first test signal T1 and generate the control signal Vc_mode for controlling multiplexers 232 and 234 to test the first scan chain; at this moment, the first test signal T1 may sequentially pass through the flip-flop 212, the multiplexer 232, the flip-flops 214, 216 and 218, and the multiplexer 234, and then generate the test result Tout1 in order to determine whether functions of the aforementioned components are correct. When the chip 200 performs a test of the second scan mode, the external automatic test equipment may input the second test signal T2 and generate the control signal Vc_mode for controlling the multiplexers 232 and 234 to test the second scan chain; at this moment, the second test signal T2 may sequentially pass through the multiplexer 232, the flip-flops 214 and 216, the multiplexer 234, the negative edge-triggered flip-flops 222_1 and 222_2, and the positive edge-triggered flip-flops 224_1 and 224_2, and then generate the test result Tout2 in order to determine whether functions of the aforementioned components are correct.

As mentioned above, the flip-flops 214 and 216 within the first circuit block 210, which is configured to drive the second circuit block 220, may be merged into the second scan chain of the second circuit block 220 for completely testing the interconnections between the first circuit block 210 and the second circuit block 220 and combinational logic circuits connected with each other when testing the second scan chain, which can increase integrity of the test.

Figure 3:
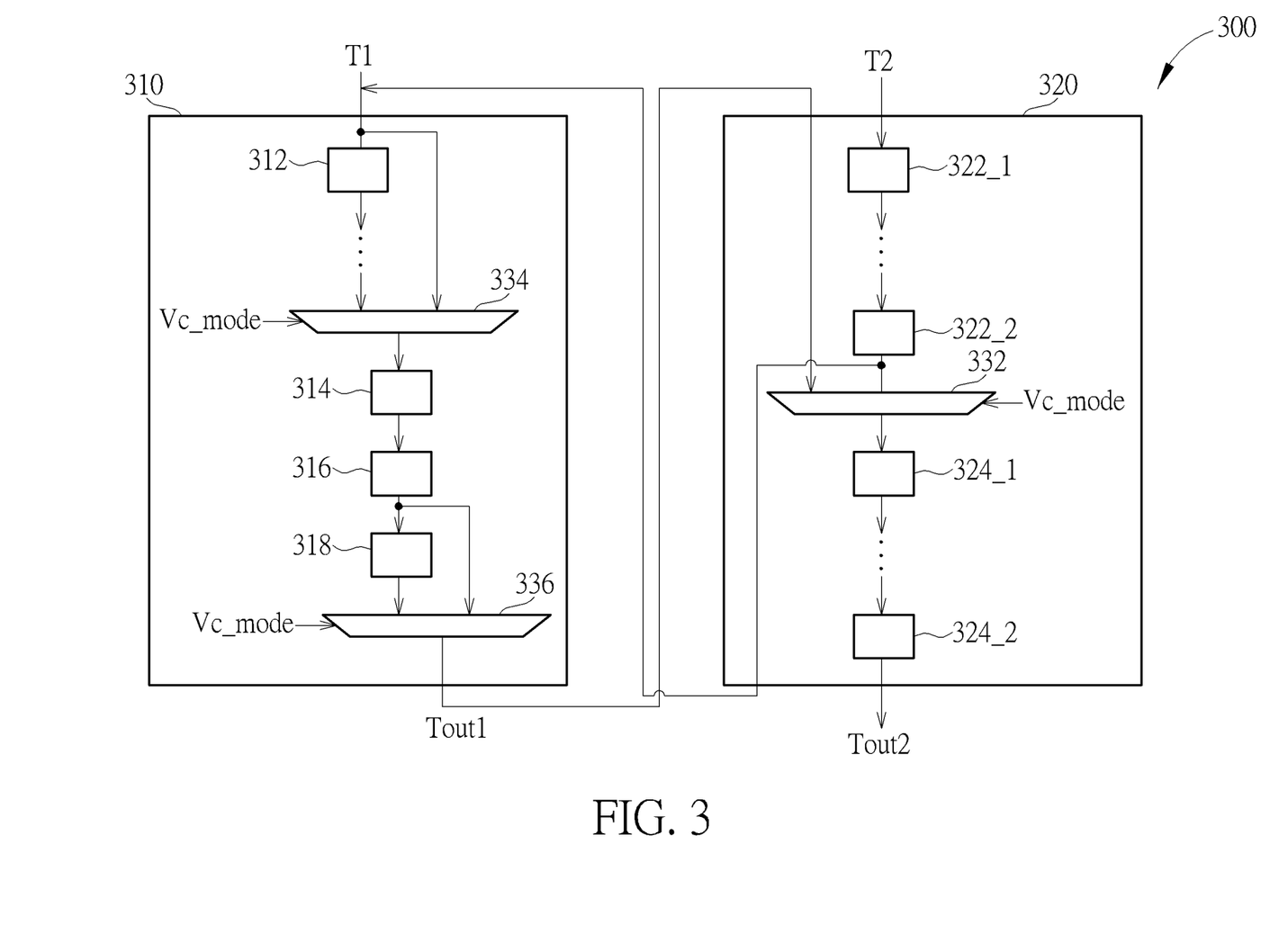
FIG. 3 is a diagram illustrating a chip with multiple scan modes for testing according to another embodiment of the present invention.

FIG. 3 is a diagram illustrating a chip 300 with multiple scan modes for testing according to another embodiment of the present invention. As shown in FIG. 3, the chip 300 comprises a first circuit block 310 and a second circuit block 320, where the first circuit block 310 and the second circuit block 320 respectively correspond to a first scan mode and a second scan mode, and the first scan mode and the second scan mode respectively receive a first test signal T1 and a second test signal T2 from an external automatic test equipment at different time points, to test whether functions of the first circuit block 310 and the second circuit block 320 are correct.

In this embodiment, the first circuit block 310 comprises several flip-flops 312, 314, 316 and 318, and two multiplexers 334 and 336, and the second circuit block 320 comprises some first flip-flops (such as negative edge-triggered flip-flops 322_1 and 322_2 in this embodiment), a multiplexer 332 and some second flip-flops (such as positive edge-triggered flip-flops 324_1 and 324_2 in this embodiment). In this embodiment, it is assumed that the flip-flops 314 and 316 within the first circuit block 310 may generate driving signals or digital signals into the second circuit block 320 during functional operations of the chip 300; in other words, there are interconnections and signal transmission between the flip-flops {314, 316} within the first circuit block 310 and the second circuit block 320.

In this embodiment, a test protocol specification assumes that all negative edge-triggered flip-flops have to be positioned ahead of positive edge-triggered flip-flops in one scan chain, where the embodiment of FIG. 3 is illustrated based on this test protocol, but the present invention is not limited thereto.

In this embodiment, the first circuit block 310 comprises a first scan chain, where the first scan chain sequentially comprises the flip-flops 312, 314, 316 and 318. In addition, the flip-flops 314 and 316 within the first circuit block 310 may generate the driving signals or the digital signals to the second circuit block 320 during the functional operations of the chip 300. The flip-flop 314 is assumed to be a negative edge-triggered flip-flop and the flip-flop 316 is assumed to be a positive edge-triggered flip-flop, thus the flip-flops 314 and 316 may be positioned between the negative edge-triggered flip-flop 322_2 and the positive edge-triggered flip-flop 324_1, and the second scan chain therefore sequentially comprises the negative edge-triggered flip-flops 322_1 and 322_2, the flip-flops 314 and 316, and the positive edge-triggered flip-flops 324_1 and 324_2. In detail, when the chip 300 performs a test of the first scan mode, the external automatic test equipment may input the first test signal T1 and generate the control signal Vc_mode to control multiplexers 334 and 336 to test the first scan chain; at this moment, the first test signal T1 may sequentially pass through the flip-flop 312, the multiplexer 334, the flip-flops 314, 316 and 318, and the multiplexer 336, and then generate the test result Tout1 in order to determine whether functions of the aforementioned components are correct. When the chip 300 performs a test of the second scan mode, the external automatic test equipment may input the second test signal T2 and generate the control signal Vc_mode to control the multiplexers 332, 334 and 336 to test the second scan chain; at this moment, the second test signal T2 may sequentially pass through the negative edge-triggered flip-flops 322_1 and 322_2, the multiplexer 334, the flip-flops 314 and 316, the multiplexer 336, the multiplexer 332, and the positive edge-triggered flip-flops 324_1 and 324_2, and then generate the test result Tout2 in order to determine whether functions of the aforementioned components are correct.

As mentioned above, the flip-flops 314 and 316 within the first circuit block 310, which is configured to drive the second circuit block 320, may be merged into the second scan chain of the second circuit block 320, to completely test the interconnections between the first circuit block 310 and the second circuit block 320 and combinational logic circuits connected with each other when testing the second scan chain, which can increase integrity of the test.

The embodiments of FIGS. 1-3 respectively illustrate that scan path designs may vary according to different types of flip-flops within the first circuit blocks 110/210/310 for driving the second circuit blocks 120/220/320. Those skilled in the art should understand the detailed circuit architectures shown in FIGS. 1-3 are for illustrative purposes only, and are not limitations of the present invention. As long as a first circuit block has a flip-flop to drive a second circuit block, which is simultaneously used by a first scan chain and a second scan chain, modifications of the above circuit design should also belong to the present invention.

Figure 4:
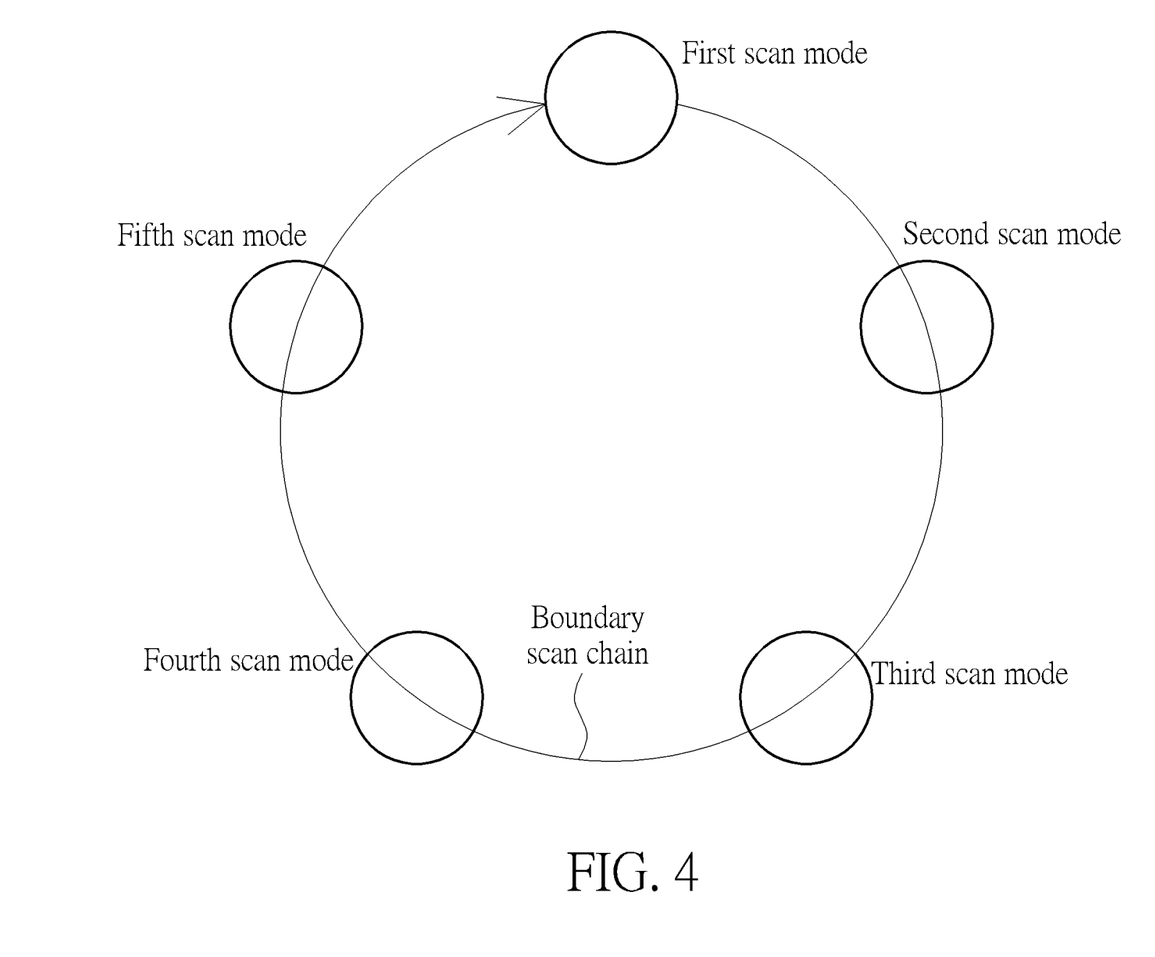
FIG. 4 is a diagram illustrating a scan chain design of a chip according to an embodiment of the present invention.

FIG. 4 is a diagram illustrating a scan chain design of a chip according to an embodiment of the present invention. As shown in FIG. 4, the chip comprises five scan modes (five circuit blocks), and interconnections across different scan modes and related boundary circuits are serially connected as a single boundary scan chain according to a test protocol. The boundary scan chain may perform testing when testing each scan mode, to detect whether interconnections between the scan modes and combinational logic circuits have any defects in order to effectively increase fault coverage.

Figure 5:
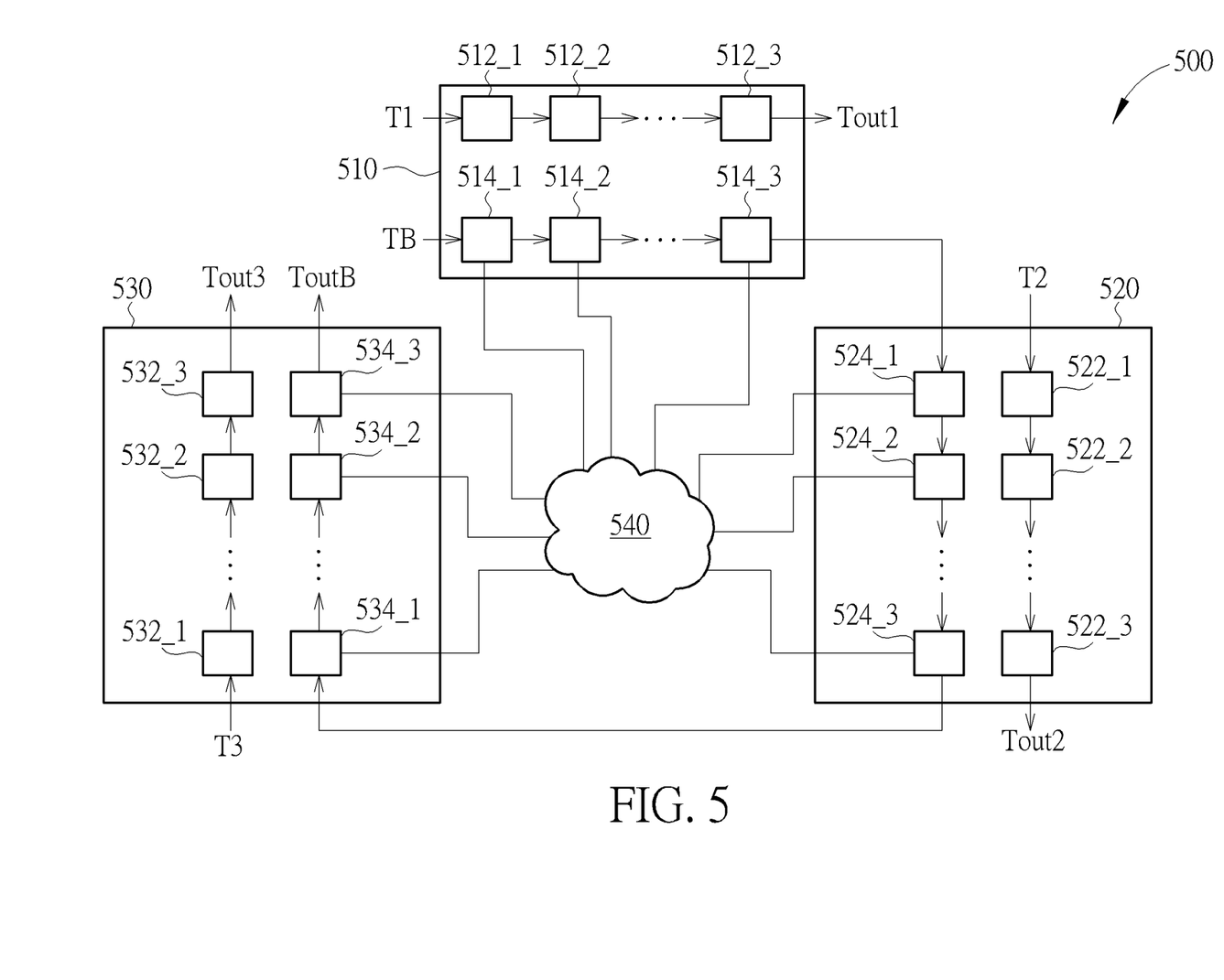
FIG. 5 is a diagram illustrating a chip designed according to the concept shown in FIG. 4.

FIG. 5 is a diagram illustrating a chip 500 designed according to the concept shown in FIG. 4. As shown in FIG. 5, the chip 500 comprises a first circuit block 510, a second circuit block 520 and a third circuit block 530, where the first circuit block 510, the second circuit block 520 and the third circuit block 530 respectively correspond to a first scan mode, a second scan mode and a third scan mode. The first scan mode, the second scan mode and the third scan mode respectively receive a first test signal T1, a second test signal T2 and a third test signal T3 from an external automatic test equipment (not shown) at different time points, to test whether functions of corresponding circuit blocks are correct.

In this embodiment, the first circuit block 510 comprises flip-flops 512_1, 512_2 and 512_3 that form a scan chain, and flip-flops 514_1, 514_2 and 514_3 that form a portion of a boundary scan chain. The second circuit block 520 comprises flip-flops 522_1, 522_2 and 522_3 that form a scan chain, and flip-flops 524_1, 524_2 and 524_3 that form another portion of the boundary scan chain. The third circuit block 530 comprises flip-flops 532_1, 532_2 and 532_3 that form a scan chain, and flip-flops 534_1, 534_2 and 534_3 that form another portion of the boundary scan chain. In this embodiment, the flip-flops that form the boundary scan chain are connected with other circuit blocks through a logic circuit 540.

In this embodiment, when the chip 500 performs a test of the first scan mode, the external automatic test equipment may input the first test signal T1 and a boundary function test signal TB; at this moment, the first test signal T1 may sequentially pass through the flip-flops 512_1, 512_2 and 512_3, and then generate a test result Tout1 in order to determine whether functions of the aforementioned components are correct. At the same time, the boundary function test signal TB may sequentially pass through the flip-flops 514_1, 514_2, 514_3, 524_1, 524_2, 524_3, 534_1, 534_2 and 534_3, and then generate a test result ToutB in order to determine whether functions of the aforementioned components are correct. When the chip 500 performs a test of the second scan mode, the external automatic test equipment may input the second test signal T2 and the boundary function test signal TB; at this moment, the second test signal T2 may sequentially pass through the flip-flops 522_1, 522_2 and 522_3, and then generate a test result Tout2 in order to determine whether functions of the aforementioned components are correct. At the same time, the boundary function test signal TB may sequentially pass through the flip-flops 514_1, 514_2, 514_3, 524_1, 524_2, 524_3, 534_1, 534_2 and 534_3, and then generate the test result ToutB in order to determine whether functions of the aforementioned components are correct. When the chip 500 performs a test of the third scan mode, the external automatic test equipment may input the third test signal T3 and the boundary function test signal TB; at this moment, the third test signal T3 may sequentially pass through the flip-flops 532_1, 532_2 and 532_3, and then generate a test result Tout3 in order to determine whether functions of the aforementioned components are correct. At the same time, the boundary function test signal TB may sequentially pass through the flip-flops 514_1, 514_2, 514_3, 524_1, 524_2, 524_3, 534_1, 534_2 and 534_3, and then generate a test result ToutB in order to determine whether functions of the aforementioned components are correct.

In this embodiment, since the boundary scan chain may perform testing under each scan mode, flip-flops can be provided within each scan mode with controllable and observable values (e.g. through the logic circuit 540 or other connections), and the embodiment of the present invention can thereby effectively detect whether interconnections between circuit blocks and combinational logic circuits have any defects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit having multiple scan modes for testing, comprising:
    a first circuit block, corresponding to a first scan mode of the multiple scan modes, including at least one first scan chain for receiving a first test signal from an external automatic test equipment for the testing; and
    a second circuit block, corresponding to a second scan mode of the multiple scan modes, including at least one second scan chain for receiving a second test signal from the external automatic test equipment for the testing;
    wherein the second scan chain includes at least one specific flip-flop positioned in the first circuit block and configured to drive the second circuit block;
    wherein the second scan chain comprises a plurality of first flip-flops positioned in the second circuit block and a plurality of second flip-flops positioned after the plurality of first flip-flops, and said at least one specific flip-flop is positioned ahead of the plurality of first flip-flops, wherein the plurality of first flip-flops and said at least one specific flip-flop are one of positive edge-triggered flip-flops and negative edge-triggered flip-flops, and the plurality of second flip-flops are the other of the positive edge-triggered flip-flops and the negative edge-triggered flip-flops.

2. The circuit of claim 1, wherein the first scan chain of the first circuit block comprises said at least one specific flip-flop.

3. The circuit of claim 2, wherein a time of the first circuit block in the first scan mode receiving the first test signal from the external automatic test equipment is different from a time of the second circuit block in the second scan mode receiving the second test signal from the external automatic test equipment.

4. The circuit of claim 1, wherein the first circuit block comprises:
    a first multiplexer, configured to transmit a first signal or a second signal to said at least one specific flip-flop according to a first control signal.

5. The circuit of claim 4, wherein the first signal is generated according to the first test signal in the first scan mode, and the second signal is generated according to the second test signal in the second scan mode.

6. The circuit of claim 4, wherein the first circuit block further comprises:
    a second multiplexer, configured to select a third signal or a fourth signal to be an output of the second multiplexer according to a second control signal, wherein the third signal is generated according to the first test signal in the first scan mode, and the fourth signal is generated according to the second test signal in the second scan mode.

7. The circuit of claim 6, wherein the fourth signal is generated according to an output of said at least one specific flip-flop in the second scan mode.

8. A circuit having multiple scan modes for testing, comprising:
    a first circuit block, corresponding to a first scan mode of the multiple scan modes, including at least one first scan chain for receiving a first test signal from an external automatic test equipment for the testing; and
    a second circuit block, corresponding to a second scan mode of the multiple scan modes, including at least one second scan chain for receiving a second test signal from the external automatic test equipment for the testing;
    wherein the second scan chain includes at least one specific flip-flop positioned in the first circuit block and configured to drive the second circuit block;
    wherein the second scan chain comprises a plurality of first flip-flops positioned in the second circuit block and a plurality of second flip-flops positioned after the plurality of first flip-flops, and said at least one specific flip-flop is positioned behind the plurality of second flip-flops, wherein the plurality of first flip-flops are one of positive edge-triggered flip-flops and negative edge-triggered flip-flops, and the plurality of second flip-flops and said at least one specific flip-flop are the other of the positive edge-triggered flip-flops and the negative edge-triggered flip-flops.

9. A circuit having multiple scan modes for testing, comprising:
    a first circuit block, corresponding to a first scan mode of the multiple scan modes, including at least one first scan chain for receiving a first test signal from an external automatic test equipment for the testing; and
    a second circuit block, corresponding to a second scan mode of the multiple scan modes, including at least one second scan chain for receiving a second test signal from the external automatic test equipment for the testing;
    wherein the second scan chain includes at least one specific flip-flop positioned in the first circuit block and configured to drive the second circuit block;

wherein the second scan chain comprises a plurality of first flip-flops positioned in the second circuit block and a plurality of second flip-flops positioned after the plurality of first flip-flops, and said at least one specific flip-flop is positioned between the plurality of first flip-flops and the plurality of second flip-flops, wherein the plurality of first flip-flops are one of positive edge-triggered flip-flops and negative edge-triggered flip-flops, and the plurality of second flip-flops are the other of the positive edge-triggered flip-flops and the negative edge-triggered flip-flops.

\* \* \* \* \*